Dec. 6, 1966 E. A. WOLFF, JR 3,290,564

SEMICONDUCTOR DEVICE

Filed Feb. 26, 1963 3 Sheets-Sheet 1

Elmer A. Wolff, Jr.
INVENTOR

Dec. 6, 1966 E. A. WOLFF, JR 3,290,564

SEMICONDUCTOR DEVICE

Filed Feb. 26, 1963 3 Sheets-Sheet 2

Elmer A. Wolff, Jr.
INVENTOR

Elmer A. Wolff, Jr.
INVENTOR

United States Patent Office 3,290,564

Patented Dec. 6, 1966

3,290,564

SEMICONDUCTOR DEVICE

Elmer A. Wolff, Jr., Richardson, Tex., assignor to Texas Instruments Incorporated, Dallas, Tex., a corporation of Delaware Filed Feb. 26, 1963, Ser. No. 261,138
20 Claims. (Cl. 317—234)

The present invention relates to semiconductor devices for high power operation.

One of the standard packages for a semiconductor high power transistor is the diamond-shaped all-metal header and a metal can. The transistor unit is mounted on the header and covers less than 1/16 of the area of the header. Electrical leads are hermetically sealed through the header with glass and connected to the transistor. The area of the header is large enough to accommodate holes in the peripheral portions for securing the package to a chassis. Although the transistor can be electrically isolated from the metal header, it is usually mounted in electrical and thermal contact therewith wherein the header constitutes the electrical connection to the collector region. Because of the massive header good thermal dissipation is provided to extract the heat generated in the transistor.

A primary consideration in the manufacture of a semiconductor power device is to provide an adequate thermal path to the active semiconductor unit for removing the heat from the package. Although the header mentioned above adequately satisfies this requirement, most of the metal header is superfluous insofar as that required to dissipate the heat. Moreover, the cost of the header is very expensive as compared to the competitive price charged the consumer since the cost of the metal, usually copper, and the excessive amount used results in the header being the most expensive component of the power transistor.

At least one problem encountered in the use of the above package is the maximum amount of current that the leads can handle. It has been found that an excessive current causes breakage of the glass-to-metal seal where the lead passes through the header as a consequence of thermal expansion. When the hermetic seal is destroyed, the performance of the device becomes degraded.

The industry has been aware of these problems for a long time, but as yet, no acceptable alternate package has been provided. Moreover, these devices are sold to consumers who have standardized on the size and shape of this package and the locations of the holes for bolting the package to a chassis. It was with these problems in mind that the present invention was conceived so as to provide a package of the same size, shape and hole configuration as the former package that has equally as good heat dissipating characteristics, but which has a much lower prime cost. However, the invention is broadly applicable to all semiconductor power devices, whether they be transistors, diodes or rectifiers, and the package is not restricted to any particular size, shape or configuration. Moreover, the problem encountered at the glass-to-metal seal between the lead and the header has been solved, so as to permit the use of much higher operating currents.

It is therefore a primary object of this invention to provide a semiconductor power device, the package of which can be manufactured at a much lower prime cost than herebefore possible, but yet is capable of dissipating as much heat from the active semiconductor unit as necessary to provide for efficient, high power operation.

A more specific object is to provide a semiconductor power device according to the preceding object wherein the package encapsulating the active semiconductor unit is comprised of a minimum amount of metal and is so constructed to provide the maximum required heat dissipation, thus reducing the prime cost of the package to a minimum.

Another object is to provide a package which has the characteristics of the package mentioned in the preceding object and which is suitable for encapsulating any active semiconductor power unit, whether the unit be a diode, rectifier, transistor or any other power unit.

Still another object is to provide a semiconductor power unit having the characteristics of the preceding objects, the package of which can be manufactured in a variety of sizes, shapes and configurations.

Yet another and more specific object is to provide a semiconductor power unit according to the preceding objects wherein the active semiconductor unit is mounted in thermal contact with but is electrically isolated from an efficient heat dissipating means.

Other objects, features and advantages will become apparent from the following description when taken in conjunction with the appended claims and the attached drawing wherein like reference numerals refer to like parts throughout the several figures, and in which:

FIG. 1*a* is a side elevational view in section of one embodiment of the invention;

FIG. 1*b* is a top plan view taken along lines 1*b*—1*b* of FIG. 1*a*;

FIG. 1*c* is a bottom plan view of the device of FIG 1*a*;

FIGS. 2*a* and 2*b* are, respectively, a side elevational view in section and a top plan view of another embodiment of the invention;

Figure 3:
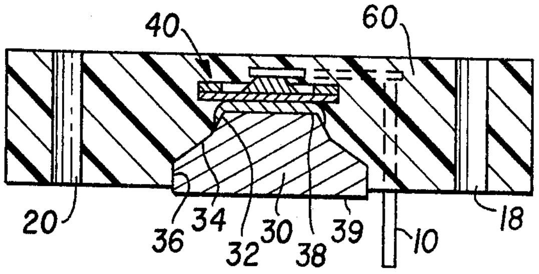
FIG. 3 is a side elevational view in section of another embodiment.
Figures 4, 5A:
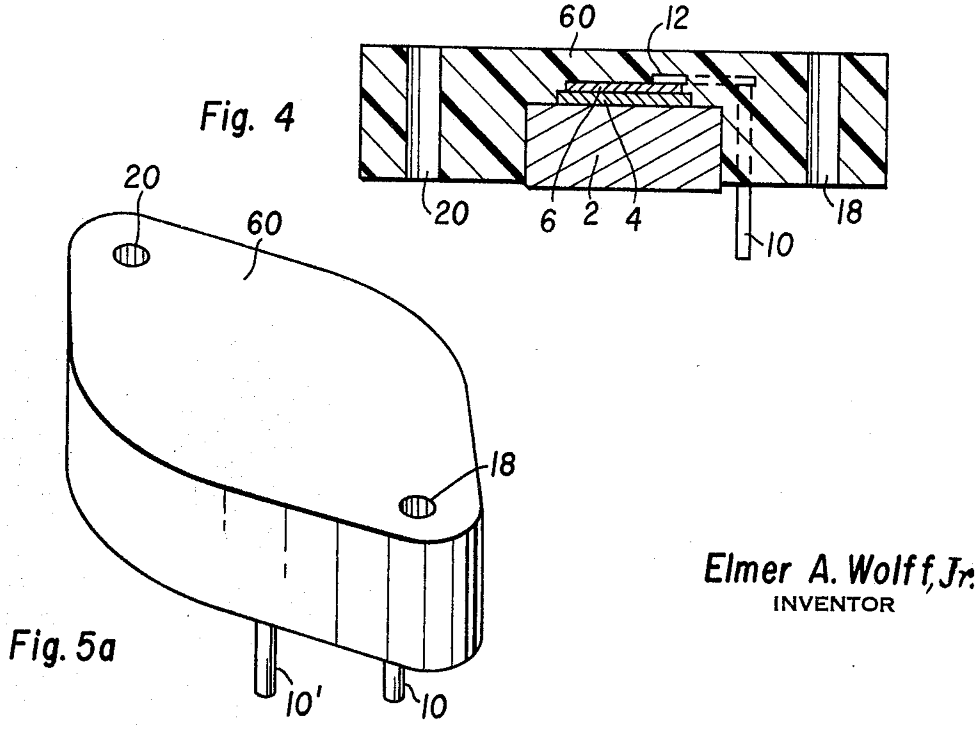
FIG. 4 is a side elevational view in section of yet another embodiment.
Figure 5B:
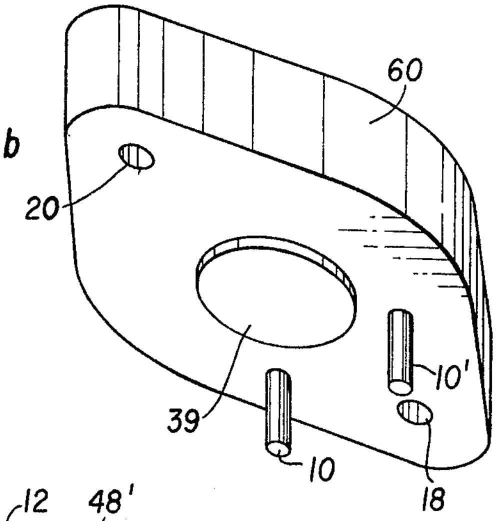
Figure 6:
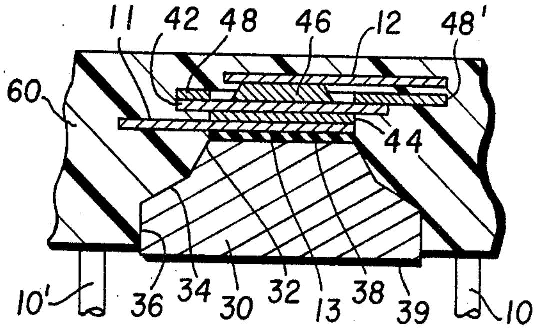
Figure 7:
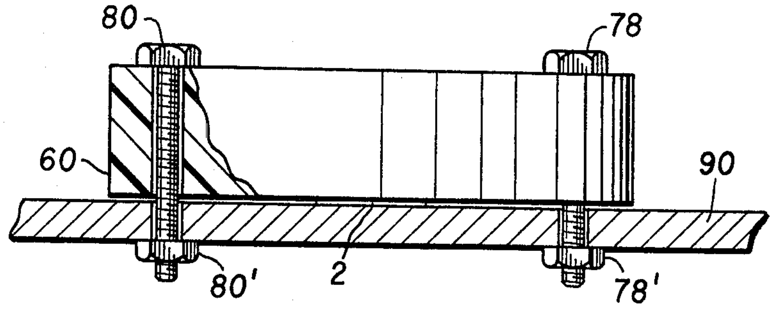

FIGS. 5*a* and 5*b* are pictorial views of the devices of FIGS. 3 and 4;

FIG. 6 is a side elevational view in section of a portion of a device wherein the active semiconductor unit is mounted in thermal contact with but is electrically isolated from the heat dissipating means of the package; and FIG. 7 illustrates the power device secured to a circuit chassis.

According to the invention, a semiconductor power unit, such as a high power transistor, is mounted in thermal contact with a heat sink, comprised of metal, for example, the size of which is just adequate to transfer to a suitable cold reservoir the heat generated within the power unit when the sink is in thermal contact with the reservoir. For example, a circuit chassis acts as a cold reservoir when the device is mounted thereon with the heat sink in thermal contact therewith. The heat sink is cast in an insulating material which is preferably an epoxy resin or a plastic the shape of which conforms to a semiconductor device header of the desired configuration. The active semiconductor unit is enclosed and hermetically sealed either with the epoxy resin or plastic, or a conventional metal can covers the unit with the open end of the can sealed in the plastic instead of the electrical leads being sealed through the metal portion of the header by a glass-to-metal seal, the leads being sealed through the insulating material. The insulating material provides the necessary support for the leads, heat sink and semiconductor unit and serves as a means for securing the device to a member such as a circuit chassis to establish a pressure thermal contact between the heat sink and the chassis.

This device, then, includes a heat sink that is capable of transferring away from the semiconductor unit the required amount of heat and an insulating base that supports the components of the device. This results in a very low basic cost because of the use of the insulating base, such as a plastic, to perform the function of an otherwise metal header, with a consequent reduction in the cost of the bulk metal.

Figure 1A:
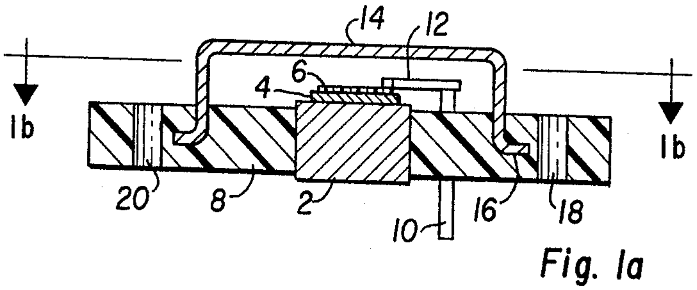

Referring specifically to FIG. 1*a*, which is an elevational view in section of one embodiment of the invention, there is shown a generally cylindrically shaped metal heat sink 2 on the top surface of which is mounted a semiconductor power unit 4 by conventional means. The heat sink is preferably comprised of a metal or alloy having a high thermal conductance, such as copper, and the sink is additionally plated with gold to prevent contamination of the unit. The unit is soldered or alloyed to the sink by any conventional means to provide a good thermal contact therewith. The sink and unit are then placed in a suitable mold, and two electrical leads 10 (only a single lead being shown) are held in the mold in spaced relation to the heat sink. An electrical connection 12 is welded or soldered between each lead 10 and corresponding electrode 6 to an active region of the semiconductor unit. A conventional cylindrical metal can 14 is also held in the mold in proper orientation with the heat sink to enclose the semiconductor unit. A plastic or epoxy resin is then cast around the heat sink and the open end 16 of the can as shown to form an insulating base of the desired configuration. The insulating base surroundingly seals the heat sink, leads and the open end of the can to form an enclosed semiconductor device, and provides the supporting structure for these parts. Preferably, an incremental amount of the heat sink protrudes from the lower surface of the base so that a good thermal contact can be established between the sink and a metal circuit chassis to which the device will subsequently be mounted. Holes 18 and 20 are provided in the extreme portions of the header for securing the device to a chassis.

Figure 1B:
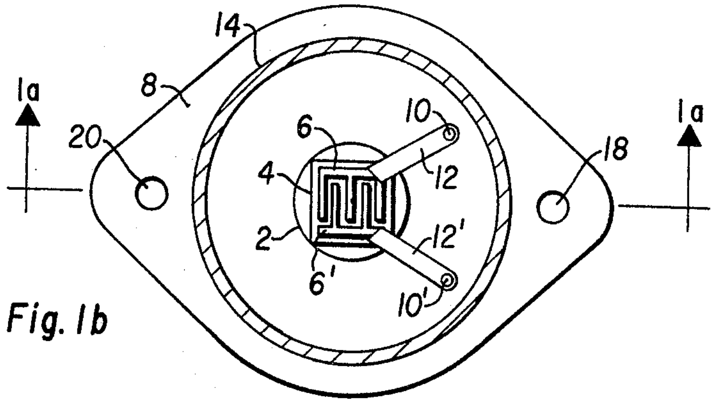
Figure 1C:
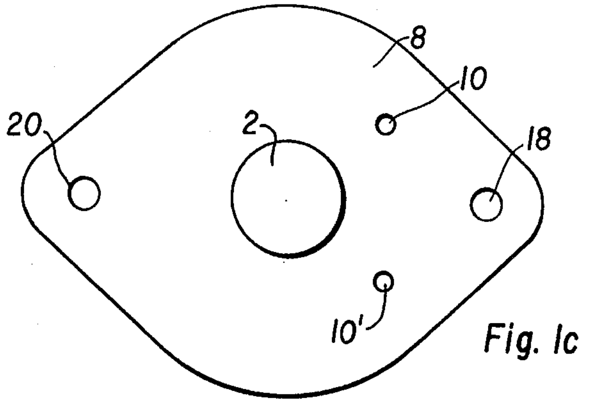

A top plan view, taken along lines 1*b*–1*b* of FIG. 1*a*, is shown in FIG. 1*b*, where the top of the can is cut away to show the active semiconductor unit. A bottom plan view is shown in FIG. 1*c*. The device shown in FIGS. 1*a*–1*c* is especially adapted for accomodating either a planar or mesa, double-diffused power transistor or a planar or mesa, diffused rectifier. Normally, the collector region of the transistor is mounted in thermal and electrical contact with the heat sink, so that the latter serves as the electrode to this region. In FIG. 1*b*, there is shown a planar transistor having a base electrode 6′ connected to one lead 10′ by means of a wire or tab 12′, and an emitter electrode 6 connected to another lead 10 by means of another wire or tab 12. As aforementioned, the leads 10 and 10′ are embedded in and hermetically sealed through the base 8, with the can 14 enclosing the top of the leads and the semiconductor unit. The bottom view in FIG. 1*c* illustrates the exposed bottom surface of the base 8 and the heat sink 2, the leads 10 and 10′ and the holes 18 and 20.

Because the consumer market has adopted the conventional diamond-shaped power transistor header as a standard for many applications, the base shown in FIGS. 1*a*–1*c* is shown in this configuration of exactly the same dimensions, including the hole diameters and locations. It is to be understood, however, that the header can be cast in any desired shape.

The heat sink 2 is large enough to handle the dissipation of the maximum amount of heat generated by the semiconductor unit, since the area of the heat sink is as large as the area of the semiconductor unit which generates the heat. The thermal flow path is from the semiconductor unit through the heat sink and into a colder reservoir, such as a circuit chassis to which the device is mounted, wherein the semiconductor unit is mounted on a surface of the heat sink substantially opposite the exposed surface of the heat sink in thermal contact with the chassis. The amount of heat conducted from the unit to the cold reservoir is a function of the area of the heat sink and the temperature difference between the unit and the reservoir, and is a function of the reciprocal of the length of the sink between the unit and the reservoir. Thus the thinner the heat sink, the more heat that can be conducted per unit of time. However, if short duration, large surges of power above the normal operating power are generated in the unit due to current surges, the unit will tend to overheat, primarily because of the thermal resistance of the pressure interface between the heat sink and the reservoir as contrasted to the low thermal resistance soldered or alloyed contact between the unit and the heat sink. In other words, a relatively large temperature drop will often occur at the heat sink, reservoir interface. To preclude the overheating effect, the heat sink is not made as thin as possible, but rather is sufficiently massive to absorb surges of power at constant temperature, thus preventing a significant rise in temperature of the semiconductor unit.

Illustrative of the dimensions of a power transistor designed to dissipate 150 watts of power, the semiconductor unit will have an area of about 0.01 to about .04 square inch, and the heat sink will have a diameter slightly larger than the diagonal of the unit. The thickness of the sink is about 0.15 to about 0.30 inch, as is the thickness of the insulating base. The can diameter is about 0.75 inch, which is the conventional size. The header configuration and dimensions are conventional, namely about 1.5 inch long by about 1.25 inch wide and generally of diamond shape.

The composition of the base is preferably a plastic because of its low cost and ease of molding. In this connection, plastic is used in a broad sense and is referred to as a substance which during its manufacture is subject to molding and shaping, and which after setting, curing, etc. retains its shape as a firm or rigid body. Preferably, the plastic is an epoxy or epoxy resin, which is an organic substance that is polymerized to form a firm or rigid body.

The heat sink is preferably comprised of a metal or alloy for purposes of good thermal conductance. In this case, the heat sink is normally gold-plated to prevent contamination of the semiconductor unit by the metal or alloy. However, it may be desirable that the heat sink be a suitable thermally conducting insulator, of which boron-nitride is an excellent example.

The leads 10 and 10′ are, of course, electrical conductors, the outer surface or the entire composition of which is gold to prevent contamination of the unit. It is also to be noted in connection with the leads that more current can be used as compared to a conventional device in which the leads are hermetically sealed through a metal header by a glass-to-metal seal. This follows since cracking and damage of the glass-to-metal seal is encountered in the conventional device as a result of widely different coefficients of expansion of the glass and metal, whereas the expandable and semi-resilient nature of the plastic base permits the necessary expansion without damaging the seal.

Figure 2A:
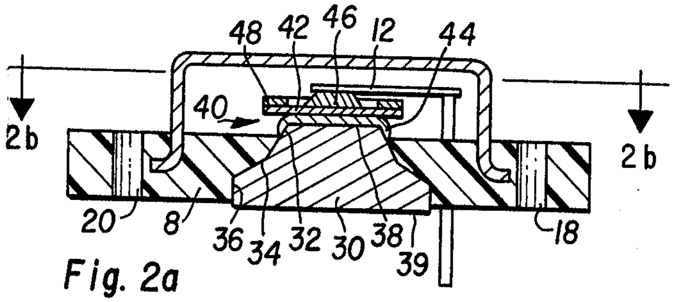

An enlarged view of a package similar to that shown in FIG. 1*a* is shown in FIG. 2*a*, and this embodiment is especially adapted for packaging alloyed power transistors, namely those having alloyed collector and emitter regions. This type of power transistor is common in the industry and is typically fabricated by alloying a small mass of indium to which has been added the proper amount of conductivity type determining impurity to a wafer of single crystal germanium to form the emitter region, and following the same procedure for making the collector region. Instead of using the cylindrical heat sink, one of a general cone shape is used that has a flat upper surface 38 of circular area. The heat sink is preferably comprised of two conical sections; namely, one section 32 whose outer surface makes an angle of about 25°–35°; with the normal to the upper surface and is adjacent thereto, and an intermediate conical section 34 whose surface makes an angle of about 50°–70° with said normal. A cylindrical section 36 forms the lower end of the heat sink and has a flat lower surface 39 also of circular area. For an alloyed germanium power transistor whose collector region has a diameter of about 0.150 inch or less, the upper surface 38 has an equal or slightly larger diameter; the upper conical section is about .05–.08 in thickness, the intermediate conical section is about 0.03–0.05 inch in thickness, and the cylindrical section is about 0.02–0.04 inch in thickness, with a lower surface whose diameter is about 0.50 inch. The generally conical shape of the heat sink takes into account the spreading of the thermal flow from its source to the reservoir, and is thus a somewhat more efficient heat sink than the cylindrical unit shown in FIG. 1*a*, whereas the latter has the advantage of simplicity of design and fabrication.

Referring particularly to the alloyed power unit generally designated at 40, the collector region 44 is soldered or alloyed to the upper surface of the gold-plated heat sink, where the indium collector is preferably used as the solder. The angle between the wall of the upper conical section 32 and the normal to the surface 38 is not abrupt, as indicated above (the angle would be abrupt in the cast of the surface and the wall forming an angle approximating 90°), and thus allows the solder to flow down the sides of the conical section during soldering. This prevents the indium from flowing up on the semiconductor wafer and shorting out the collector-base junction, while additionally allowing the indium between the unit and the heat sink to "thin-out" to a very thin film. The latter is important in that indium is not as good a heat conductor as most metals, and the thinner this film, the more efficient is the heat conduction. This same heat sink can be used in conjunction with planar or mesa power transistors as described above to give a thin solder layer for efficient heat conduction, although the problem of shorting of the junction does not exist.

Figure 2B:
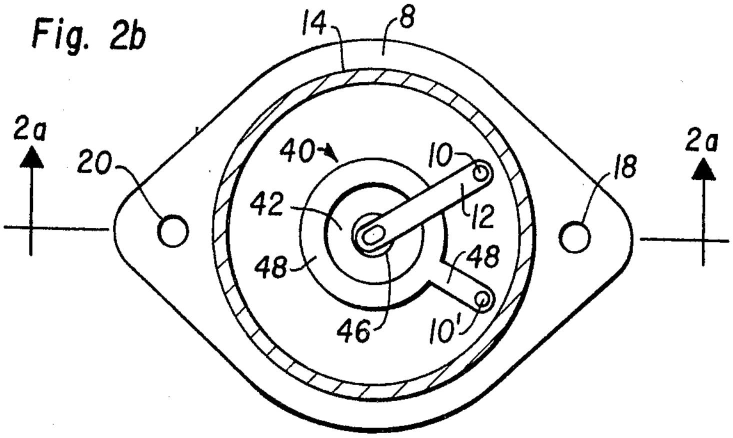

The rest of the alloyed transistor comprises a semiconductor wafer 42 to which the collector region 44 is alloyed, and an emitter region 46 alloyed to the face of the wafer opposing the collector. A concentric metal ring 48 is welded to the wafer at the periphery for making contact to the base region (wafer 42). A top plan view of the package is shown in FIG. 2*b* and illustrates the concentric metal ring 48 which has an integral tab 48′ welded to a lead 10′ passing through the plastic base 8. A tab 12 is soldered at one end to the emitter region 46 and is welded at the other end to another lead 10 passing through the header.

The package just described is the same as that shown in FIGS. 1*a*–1*c* with the exception of the configuration of the heat sink and the particular semiconductor power unit used in conjunction therewith, although this heat sink can be used in conjunction with any power unit. The dimensions of the heat sink as noted above are those for most high power germanium alloy transistors, such as, for example, the 2N456A, which is the standard designation given to a particular device by the Joint Electronics Association. The dimensions of the base 8 and can 14 are the same as given above, and the location of the leads 10 and 10′ likewise are the same.

A preferred embodiment of the invention is shown in FIG. 3, and comprises a heat sink 30 and an alloyed power transistor 40 that are the same as described with reference to FIG. 2*a*. However, all of the heat sink, with the exception of the lower surface thereof as described above, and the entire active semiconductor unit, is embedded or cast in the plastic base. The procedure for casting the package is substantially the same as previously described, where the unit is soldered to the heat sink, the leads 10, 10′ are jigged-up in the proper relation with the heat sink, electrical connections are made between the active electrode regions of the semiconductor unit and the respective leads, and the entire structure is cast in plastic. This package has the advantage of obviating the necessity for a can to cover the active unit by combining the base and can into a single plastic package that serves as both. The dimensions and shapes are identical to those described earlier, but here, the thickness of the base is about 0.3 inch and is sufficient to cover the entire unit with about 0.15–0.20 inch of plastic between the upper surface of the package and the top of the active semiconductor unit.

A package utilizing a cylindrical heat sink identical to that of FIG. 1*a* is shown in FIG. 4 and is likewise completely encapsulated in plastic. Pictorial views of either of the packages of FIGS. 3 and 4 are shown in FIGS. 5*a* and 5*b*.

The packages of FIGS. 3 and 4 have all of the advantages noted in conjunction with those described earlier, but have the additional feature of consolidating the base and can into a single plastic body. The manufacturing costs of these packages are substantially reduced over packages heretofore available. To illustrate, the cost of the metal used in the fabrication of an all metal header is over three times more than the cost of the metal heat sink of the package shown in FIG. 3, for example; yet the same heat dissipation is achieved for both. The cost of the plastic is quite low and is not comparable to the cost of metal. Several manufacturing steps are eliminated in the production of the package of this invention, since the leads do not have to be hermetically and insulatingly sealed through the header by glass and no welding operation is required to affix a can to the header. All of these steps are carried out simultaneously in the casting of the package.

To illustrate how the invention is equally adaptable to the provision of an isolated power transistor, reference is had to FIG. 6, which is a package substantially equivalent to that shown in FIG. 3, except that the transistor 40 is electrically isolated from but is mounted in thermal contact with heat sink 30. To effect this, an insulating layer 13 is provided between the uper surface 38 of the heat sink and the collector region 44 of the transistor. This is done by conventional methods, such as, for example, evaporating or sputtering onto the gold-plated upper surface 38 a very thin layer of an insulator such as a ceramic, subsequently evaporating or sputtering onto the surface of the insulating layer a thin metallic layer, such as gold, and soldering or alloying the transistor to the metallic layer. If the insulating layer is made very thin to give good thermal conductance, practically any ceramic is suitable, although a high thermal conductance material such as boron-nitride is preferred. Alternatively, an electrical insulating heat sink is used as noted above. Since the collector region is isolated from the heat sink, an additional electrical connection to this region is required, and a tab 11 is interposed between the collector region and the insulating layer and is connected to a lead 10″ similar to lead 10. Thus there is complete electrical isolation of the transistor.

To illustrate the mounting of the package to a circuit chassis 90, reference is had to FIG. 7, where bolts 78 and 80, for example, are passed through the leads in the base and through holes cut in the chassis. Nuts 78′ and 80′ are used to tightly secure the package to the chassis with the aid of the bolts. In this manner a pressure thermal contact between the heat sink 2 and the chassis is made. It is to be expressely understood, however, that holes need not be provided in the base if some alternative means is used to secure the package to the chassis.

The invention has been described with reference to several embodiments and various illustrative dimensions have been given for a better understanding thereof. However, it is expressly understood that the dimensions given are in no way intended to limit the invention. Because of the present need for power transistor packages the headers of which are of the general diamond-shaped configuration, the preferred embodiments of the invention have been described with reference to such a shape. It is to be understood, however, that any configuration and shape is suitable for the purposes of this invention, such as a cylindrical or square header, or any other shape deemed expedient for the desired application. And, as aforementioned, any power semiconductor unit, whether it be a diode, rectifier, etc., can be used in conjunction with the packages described.

Other modifications and substitutions that do not depart from the true scope of the invention will become apparent to those skilled in the art, and the invention is to be limited only as defined in the appended claims.

What is claimed is:

1. A semiconductor power device comprising
(a) a base of insulating material,
(b) a heat sink having a flat surface,
(c) a semiconductor unit mounted in thermal contact with a surface of said heat sink substantially opposite said flat surface,
(d) at least a portion of the body of said heat sink being surroundingly sealed in said base with said flat surface being exposed,
(e) means enclosing said semiconductor unit, and
(f) electrically conducting means sealed in and protruding from said base making electrical connections to the active regions of said semiconductor unit,
(g) said base adapted for being secured to a member that includes a thermally conducting surface in thermal contact with said flat exposed surface.

2. A semiconductor power device comprising
(a) a base of insulating material,
(b) an electrically conducting heat sink having a flat surface,
(c) a semiconductor unit mounted in thermal contact with a surface of said heat sink substantially opposite said flat surface,
(d) said contact establishing an electrical connection between said heat sink and one of the active regions of said semiconductor unit,
(e) at least a portion of the body of said heat sink being surroundingly sealed in said base with said flat surface being exposed,
(f) means enclosing said semiconductor unit, and
(g) electrically conducting means sealed in and protruding from said base making electrical connections to the other active regions of said semiconductor unit,
(h) said base adapted for being secured to a member that includes a thermally conducting surface in thermal contact with said flat exposed surface.

3. A semiconductor power device according to claim 1 wherein said heat sink is comprised of an electrically insulating material.

4. A semiconductor power device according to claim 1 wherein said semiconductor unit is electrically isolated from said heat sink.

5. A semiconductor power device according to claim 1 wherein said base is a firm body comprised of a plastic.

6. A semiconductor power device according to claim 1 wherein said base is a firm body comprised of an epoxy resin.

7. A semiconductor power device according to claim 1 wherein said base defines a hole therethrough for receiving a fastener for securing said device to said member.

8. A semiconductor power device according to claim 1 whrein a portion of said heat sink including said flat exposed surface protrudes from said base.

9. A semiconductor power device according to claim 1 wherein said heat sink is cylindrical.

10. A semiconductor power device according to claim 1 wherein said heat sink is generally cone shaped with said flat exposed surface being perpendicular to the axis of said cone and the diameter of said cone of which increases toward said flat exposed surface.

11. A semiconductor power device comprising
(a) a base of insulating material,
(b) a heat sink having a flat surface,
(c) a semiconductor unit mounted in thermal contact with a surface of said heat sink substantially opposite said flat surface,
(d) at least a portion of the body of said heat sink between said flat surface and said opposite surface being surroundingly sealed in said base,
(e) means enclosing said semiconductor unit, and
(f) electrically conducting means sealed in and protruding from said base making electrical connections to the active regions of said semiconductor unit,
(g) said base adapted for being secured to a member that includes a thermally conducting surface in thermal contact with said flat surface.

12. A semiconductor power device according to claim 11 wherein said means enclosing said semiconductor unit comprises a can having its open end sealed in said base in surrounding relation to said semiconductor unit.

13. A semiconductor power device comprising
(a) a base of insulating material,
(b) a heat sink having a flat surface,
(c) a semiconductor unit mounted in thermal contact with a surface of said heat sink substantially opposite said flat surface, and
(d) electrically conducting means making electrical connections to the active regions of said semiconductor unit,
(e) said semiconductor unit and portions of said heat sink and said electrically conducting means being embedded in said base,
(f) said flat surface being exposed and the other portion of said electrically conducting means protruding from said base,
(g) said base adapted for being secured to a member that includes a thermally conducting surface in pressure thermal contact with said flat exposed surface.

14. A semiconductor power device comprising
(a) a base of insulating material,
(b) an electrically conducting heat sink having a flat surface,
(c) a semiconductor unit mounted in thermal contact with a surface of said heat sink substantially opposite said flat surface,
(d) said contact making an electrical connection between said heat sink and one of the active regions of said semiconductor unit, and
(e) electrically conducting means making electrical connections to the other active regions of said semiconductor unit,
(f) said semiconductor unit and portions of said heat sink and said electrically conducting means being embedded in said base,
(g) said flat surface being exposed and the other portions of said electrically conducting means protruding from said base,
(h) said base adapted for being secured to a member that includes a thermally conducting surface in pressure thermal contact with said flat exposed surface.

15. A semiconductor power device according to claim 13 wherein said semiconductor unit is electrically isolated from said heat sink.

16. A semiconductor power device according to claim 13 wherein said heat sink is cylindrical.

17. A semiconductor power device according to claim 13 wherein said heat sink is generally cone shaped with said flat exposed surface being perpendicular to the axis of said cone and the diameter of said cone of which increases toward said flat exposed surface.

18. A semiconductor power device comprising
(a) a firm body of a plastic having a flat major surface,
(b) a heat sink having parallel first and second major surfaces, (c) a semiconductor unit mounted on said first surface in thermal contact therewith, and (d) conducting means making electrical connections to the active regions of said semiconductor unit, (e) said semiconductor unit and portions of said heat sink and said conducting means being embedded in said body in sealed relation, (f) the other portions of said conducting means and said heat sink including said second surface protruding from said flat major surface, (g) said body of plastic adapted for being secured to a member that includes a thermally conducting surface in pressure thermal contact with said second surface of said heat sink.

19. A semiconductor power device according to claim 18 wherein said heat sink is cylindrical and said first and second surfaces are parallel to said flat major surface.

20. A semiconductor power device according to claim 18 wherein said first and second surfaces are parallel to said flat major surface and said heat sink defines a conical section along a portion of an axis perpendicular to said first and second surfaces with increasing diameter toward said second surface.

References Cited by the Examiner

UNITED STATES PATENTS

| | | | |
|---|---|---|---|
| 2,725,505 | 11/1955 | Webster et al. | 317—234 |
| 2,750,654 | 6/1956 | Owens | 317—234 |
| 2,762,001 | 9/1956 | Kilby | 317—235 |
| 2,930,904 | 3/1960 | Fritts | 317—234 |
| 3,025,437 | 3/1962 | Van Namen et al. | 317—235 |
| 3,030,693 | 4/1962 | Faskerty | 317—235 |
| 3,178,621 | 4/1965 | Glickman | 317—234 |
| 3,199,001 | 8/1965 | Dyben | 317—235 |
| 3,217,169 | 11/1965 | Grimmeiss et al. | 317—235 |

JOHN W. HUCKERT, *Primary Examiner.*

R. F. POLISSACK, *Assistant Examiner.*